(12) United States Patent
Weinrich et al.

(10) Patent No.: US 7,045,070 B1
(45) Date of Patent: May 16, 2006

(54) METHOD OF PRODUCING AN ELECTRODE CONFIGURATION AND METHOD OF ELECTRICALLY CONTACTING THE ELECTRODE CONFIGURATION

(75) Inventors: Volker Weinrich, München (DE); Manfred Engelhardt, Feldkirchen-Westerham (DE); Werner Pamler, München (DE); Hermann Wendt, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 303 days.

(21) Appl. No.: 09/645,807

(22) Filed: Aug. 24, 2000

Related U.S. Application Data (62) Division of application No. 09/110,052, filed on Jul. 3, 1998, now abandoned.

(30) Foreign Application Priority Data

Jul. 3, 1997 (DE) ................................ 197 28 474

(51) Int. Cl.
*H01B 13/00* (2006.01)
*H01L 21/00* (2006.01)

(52) U.S. Cl. ............................. 216/13; 216/18; 216/67; 216/74; 216/75; 216/6; 438/690; 438/710; 427/560

(58) Field of Classification Search ................... 216/13, 216/18, 67, 74, 75, 6; 438/690; 427/560
See application file for complete search history.

(56) References Cited

U.S. PATENT DOCUMENTS

| | | | |
|---|---|---|---|
| 4,760,481 A | 7/1988 | Yuito et al. | |
| 5,057,455 A | 10/1991 | Foo et al. | |
| 5,122,225 A | 6/1992 | Douglas | |
| 5,208,170 A | 5/1993 | Kobeda et al. | |
| 5,269,880 A * | 12/1993 | Jolly et al. | 148/DIG. 161 |
| 5,341,016 A | 8/1994 | Prall et al. | |
| 5,350,705 A | 9/1994 | Brassington et al. | |
| 5,405,799 A * | 4/1995 | Woo et al. | 438/396 |
| 5,436,190 A * | 7/1995 | Yang et al. | 438/224 |
| 5,515,984 A | 5/1996 | Yokoyama et al. | |
| 5,562,801 A | 10/1996 | Nulty | |
| 5,585,300 A | 12/1996 | Summerfelt | |
| 5,619,393 A * | 4/1997 | Summerfelt et al. | 361/321.1 |
| 5,621,606 A * | 4/1997 | Hwang | 361/321.4 |
| 5,631,185 A * | 5/1997 | Kim et al. | 438/397 |
| 5,717,236 A | 2/1998 | Shinkawata | |
| 5,883,781 A | 3/1999 | Yamamichi et al. | |
| 5,930,639 A * | 7/1999 | Schuele et al. | 438/396 |
| 5,976,394 A * | 11/1999 | Chung | 216/67 |

(Continued)

FOREIGN PATENT DOCUMENTS

JP 5-315457 * 11/1993

OTHER PUBLICATIONS

Patent Abstracts of Japan No. 1-232729 A (Sakota), dated Sep. 18, 1989.

(Continued)

*Primary Examiner*—Shamim Ahmed
(74) *Attorney, Agent, or Firm*—Laurence A. Greenberg; Werner H. Stemer; Ralph E. Locher (57) ABSTRACT

The electrode configuration includes at least one structured layer. A mask is produced on the layer to be structured and the layer is dry etched. The mask is at least slightly etchable by dry etching. The mask contains a metal silicide, a metal nitride or a metal oxide.

16 Claims, 4 Drawing Sheets

U.S. PATENT DOCUMENTS 6,004,882 A * 12/1999 Kim et al. .................. 438/706

OTHER PUBLICATIONS

"Etching of TiN local Interconnects Using HBr in a Triode Reactor with Magnetic Confinement" (Zwicker et al.), Proceedings of the International Society for Optical Engineering, vol. 1803, 1992, pp. 97-106.

"Reactive Ion Etching Mechanism of Plasma Enhanced Chemically Vapor Deposited Aluminum Oxide Film in $CF_4/O_2$ Plasma" (Kim et al.), J. Applied Physics, vol. 78, No. 3, Aug. 1995, pp. 2045-2049.

"Local Plasma Oxidation and Reactive Ion Etching of Metal Films for Ultrafine Line Pattern Inversion and Transfer" (Nulman et al.), J. Vacuum Science Technology, vol. B1, Oct.-Dec.1983, pp. 1033-1036.

"$WSi_2$/Polysilicon Gate Etching Using TiN Hard Mask in Conjunction with Photoresist" (Tabara), J. Applied Physics, vol. 36, 1997, pp. 2508-2513.

* cited by examiner

METHOD OF PRODUCING AN ELECTRODE CONFIGURATION AND METHOD OF ELECTRICALLY CONTACTING THE ELECTRODE CONFIGURATION

This application is a divisional of U.S. application Ser. No. 09/110,052, filed Jul. 3, 1998, now abandoned.

BACKGROUND OF THE INVENTION

Field of the Invention

The present invention relates to a method of producing an electrode configuration and a method of electrically contacting the electrode configuration.

In the development of highly integrated memory modules, such as DRAMs and FRAMs, for example, the cell capacity should be retained or even improved in spite of the progressive miniaturization. In order to achieve this object, ever thinner dielectric layers and folded capacitor electrodes (trench cell, stack cell) are used. Recently, new materials, in particular paraelectric and ferroelectric materials, have been used between the capacitor electrodes of a memory cell, instead of the conventional silicon oxide. For example, barium strontium titanate (BST, $(Ba,Sr)TiO_3$), lead zirconate titanate (PZT, $Pb (Zr, Ti) O_3$) and/or lanthanum-doped lead zirconate titanate or strontium bismuth tantalate (SBT, $SrBi_2Ta_2O_9$) are used for the capacitors of the memory cells in DRAMs and/or FRAMs.

These materials are thereby usually deposited on existing electrodes (bottom electrodes). Processing takes place at high temperatures, with the result that the materials of which the capacitor electrodes are normally composed, for example doped polysilicon, are easily oxidized and lose their electrically conductive properties, which would lead to the failure of the memory cell.

Because of their good resistance to oxidation and/or because of the formation of electrically conductive oxides, 4d and 5d transition metals, in particular platinum metals (Ru, Rh, Pd, Os, Ir, Pt) and in particular platinum itself, and also rhenium are promising candidates which could replace doped polysilicon as electrode material in the above-mentioned memory cells.

In order to be able to construct a memory cell from the aforesaid materials, which have not been previously used in semiconductor technology, thin layers of these materials must be structured.

The structuring of the previously used materials is carried out as a rule by means of so-called plasma-supported anisotropic etching methods. Here, physical/chemical methods are usually applied in which gas mixtures composed of one or more reactive gases are used, such as oxygen, chlorine, bromine, hydrogen chloride, hydrogen bromide and/or halogenated hydrocarbons and of inert gases (for example Ar, He). These gas mixtures are conventionally excited in an alternating electromagnetic field at low pressures.

Figure 7:
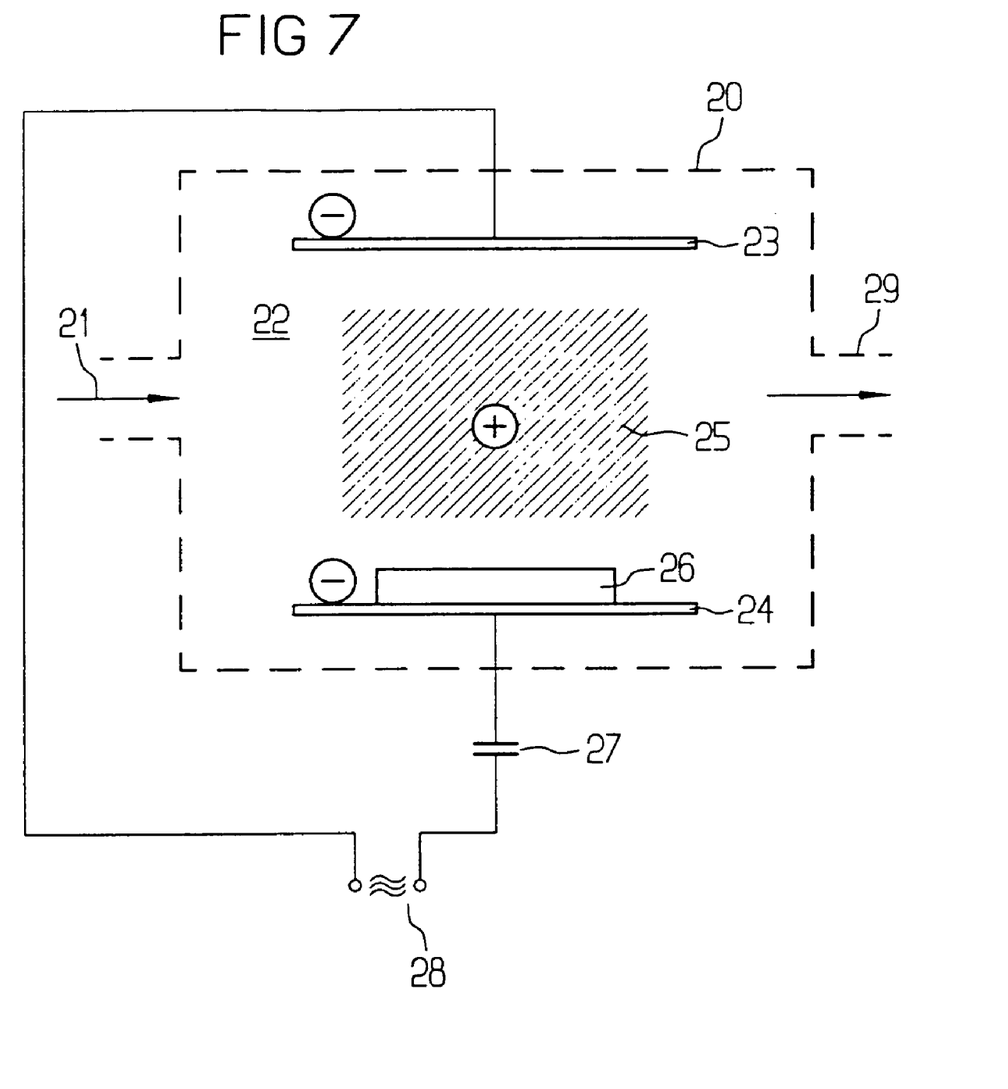
FIG. 7 is a schematic illustration of an etching chamber in the form of a parallel-plate reactor.

FIG. 7 shows the principles of the method of operation of an etching chamber, illustrated for the example of a parallel-plate reactor 20. The gas mixture, for example Ar and $Cl_2$, is fed into a reactor chamber 22 through a gas inlet 21 and pumped out through a gas outlet 29. The lower plate 24 of the parallel plate reactor is connected to a high-frequency source 28 via a capacitor 27. The lower plate 24 serves as a substrate holder. By applying a high-frequency alternating electric field to the upper and lower plates 23, 24 of the parallel-plate reactor, the gas mixture is converted into a plasma 25. Since the mobility of the electrons is greater than that of the gas cations, the upper and the lower plates 23, 24 become negatively charged with respect to the plasma 25. For this reason, both plates 23, 24 exert a high force of attraction on the positively charged gas cations, with the result that they are subjected to a permanent bombardment by these ions, for example $Ar^+$. Since, in addition, the gas pressure is kept low, typically 0.1–10 Pa, there is only a low degree of scattering of the ions with respect to one another and to the neutral particles, and the ions strike virtually perpendicular against the surface of a substrate 26 which is secured to the lower plate 24 of the parallel-plate reactor. The result is that an image of a non-illustrated mask is formed on the underlying layer of the substrate 26 which is to be etched.

Photoresists are conventionally used as mask materials. Such resists can be structured relatively simply by means of an exposure step and a development step.

The physical part of the etching is brought about by means of the momentum and kinetic energy of the incident ions (for example $Cl_2^+$, $Ar^+$). In addition, chemical reactions between the substrate and the reactive gas particles (ions, molecules, atoms, radicals) are initiated or promoted (chemical part of the etching) thereby, accompanied by the formation of volatile reaction products. These chemical reactions between the substrate particles and the gas particles are responsible for high selectivities of the etching process.

Unfortunately, it has become apparent that the above-mentioned materials, which have newly been brought into use in memory cells, are among those materials which cannot be etched or can be etched dry-chemically only with difficulty. Further, the etching erosion is based, even when "reactive" gases are used, predominantly or almost exclusively on the physical component of the etching. Due to the fact that the chemical component of the etching is near negligible or absent, the etching erosion of the layer to be structured is of the same order of magnitude as the etching erosion of the mask and/or of the substrate (etching barrier layer), i.e. the etching selectivity with respect to the etching mask and/or substrate is generally small (between approximately 0.3 and 3.0). The result of this is that due to the erosion of masks with inclined edges and the unavoidable formation of facets on the masks only a low degree of dimensional accuracy of the structuring can be ensured.

The aforesaid problems also occur with the structuring of the top electrode of a memory cell which is constructed according to the "capacitor over bitline" principle with a so-called "stacked capacitor."

Furthermore, the use of a "stacked capacitor" leads to difficulties when making contact with the memory cell. In order to connect the memory cell to a metalization, contact holes of different depths have to be etched into an insulation layer arranged over and around the capacitor. This contact-hole etching should thereby stop at different depths in a way which is selective to different materials. In order to simplify the manufacturing process, the use of only one mask level is to be aimed at.

In a memory cell according to the "capacitor over bitline" principle with a "stacked capacitor", the contact-hole etching must firstly stop at the material of the top electrode of the capacitor. Correspondingly, the material of the top electrode is the material which is subjected to the greatest degree of over-etching, while other contact holes are further etched to lower lying layers. If the top electrode is composed, for example, of platinum, there may occur, in addition to a break-through of the top electrode also a redeposition of sputtered platinum on the inner walls of the mask opening.

This leads to so-called "fences", i.e. thin and conductive structures which remain even after the resist mask has been burnt off. These can lead to short circuits.

SUMMARY OF THE INVENTION

It is accordingly an object of the invention to provide a method of producing the electrode configuration, and a method of electrically contacting the electrode configuration, which overcomes the above-mentioned disadvantages of the prior art devices and methods of this general type.

With the foregoing and other objects in view there is provided, in accordance with the invention, an electrode configuration, comprising:

a first conductive layer of a material which is substantially unetchable by chemical dry-etching; and a second conductive layer on the first conductive layer, the second conductive layer being formed of a material which is etchable, at least with a relatively low etching rate, by chemical dry-etching.

In other words, an electrode configuration is provided which has a first conductive layer, whose material is virtually impossible to etch by means of chemical dry-etching, and at least one second conductive layer whose material can be etched, at least with a low etching rate, by means of chemical dry-etching.

Here, chemical dry-etching is to be understood as a customary chemical dry-etching using, possibly excited, halogens, hydrogen halides or halogenated hydrocarbons or using oxygen at customary temperatures and gas pressures. In addition, a material which is virtually impossible to etch by means of chemical dry-etching is to be understood to be a material which, under process conditions which are optimum for the respective material, has an etching rate of less than 1 nm/min. Correspondingly, a low etching rate is to be understood to be an etching rate which is greater than 1 nm/min under process conditions which are optimum for the respective material.

Since the material of the first layer is virtually impossible to etch by means of a chemical dry-etching, during a customary chemical/physical dry-etching the first layer is predominantly eroded by the physical part of the chemical/physical dry-etching. In contrast to this, during a customary chemical/physical dry-etching the second layer is also eroded by the chemical part of the chemical/physical dry-etching.

The invention has the advantage that the effective thickness of the electrode configuration can be increased by the height of the second layer, with the result that breaking through during the overetching when making contact with the electrode configuration is avoided. Likewise, the formation of redepositions from the material of the first layer during the overetching, which are difficult to remove, is prevented.

In addition, the layer resistance of the electrode configuration is reduced by the second layer of the electrode configuration—with an approximately constant capacity. As a result, the switching of the so-called "common plate" during the so-called "pulsed-plateline" operation of the memory cell is speeded up, as a result of which the access time of the entire module is shortened. Furthermore, the second layer of the electrode configuration permits the capacitor of the memory cell to be encapsulated with an oxide layer.

In accordance with an added feature of the invention, the first conductive layer contains a material selected from the group consisting of a 4d transition metal, a 5d transition metal, a conductive nitride thereof, and a conductive oxide thereof.

In accordance with another feature of the invention, the first conductive layer contains a material selected from the group consisting of ruthenium, rhodium, palladium, osmium, iridium, platinum, gold, silver and rhenium.

In accordance with an additional feature of the invention, the second conductive layer contains a material selected from the group consisting of aluminum, titanium, tungsten, a conductive silicide thereof, a conductive nitride thereof, and a conductive oxide thereof.

In accordance with a further feature of the invention, the second conductive layer contains a material selected from the group consisting of titanium and titanium nitride, preferably $TiN_x$ where $0.8<x<1.2$.

With the above and other objects in view there is also provided, in accordance with the invention, a method of producing an electrode configuration, which comprises the following steps:

forming a first conductive layer of a material which is substantially unetchable by chemical dry-etching;

forming a second conductive layer on the first conductive layer from a material which is etchable, at least with a relatively low etching rate, by chemical dry-etching;

structuring the second conductive layer to form a structured second layer; and dry etching the first conductive layer of the electrode configuration while using the second structured layer as a mask.

The invention has the advantage that the metals, metal silicides, metal nitrides or metal oxides of the second layer are more resistant in comparison with photoresists, with the result that chemical "burning off" of the mask is prevented. The high bonding energy of the metal atoms in metals and/or the metal ions in silicides, nitrides or oxides leads to very low erosion rates during etching processes with a high physical component. The overall result of this is that the selectivity of the etching process of the first layer is increased. The lower mask erosion results in a higher dimensional accuracy of the structuring. Furthermore, the method according to the invention also permits steeper etching edges to be obtained on the layer to be structured by means of reactive gases.

In accordance with again an added feature of the invention, the dry etching step comprises etching the first layer with a plasma etching process.

In accordance with again another feature of the invention, during the dry etching step, at least one reactive substance is provided which reacts with the material of the second layer to form a non-volatile compound on the surface of the second layer. The reactive substance is preferably a reactive gas, such as oxygen ($O_2$), nitrogen ($N_2$), hydrogen ($H_2$), halogens, gaseous halogen compounds, or mixtures thereof. In this way, the chemical part of a chemical/physical dry-etching procedure is reduced and the etching erosion is determined essentially by the physical portion of the etching.

In accordance with again an additional feature of the invention, an inert gas (e.g. argon) is provided during the step of dry etching the first layer.

The dry etching is effected with reactive ion etching (RIE), magnetically enhanced reactive ion etching (MERIE), electron cyclotron resonance etching (ECR), and inductively coupled plasma etching (ICP, TCP).

With the above objects in view there is also provided, in accordance with the invention, a method of electrically contacting an electrode configuration, which comprises the following steps:

forming an electrode configuration with a first conductive layer of a material which is substantially unetchable by chemical dry-etching, and a second conductive layer on the first conductive layer formed of a material which is etchable, at least with a relatively low etching rate, by chemical dry-etching;

applying at least one insulation layer on the electrode configuration, and structuring the insulation layer to form at least one contact hole to the electrode configuration; and depositing a conductive layer and filling in the contact hole.

In accordance with yet an added feature of the invention, the insulation layer is a silicon oxide layer produced, for example, by a TEOS process or a silane process. The insulation layer may also contain a silicon layer. In accordance with a concomitant feature of the invention, the conductive layer is formed of aluminum, tungsten, or copper.

Other features which are considered as characteristic for the invention are set forth in the appended claims.

Although the invention is illustrated and described herein as embodied in a method of producing an electrode configuration and a method of electrically contacting the electrode configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
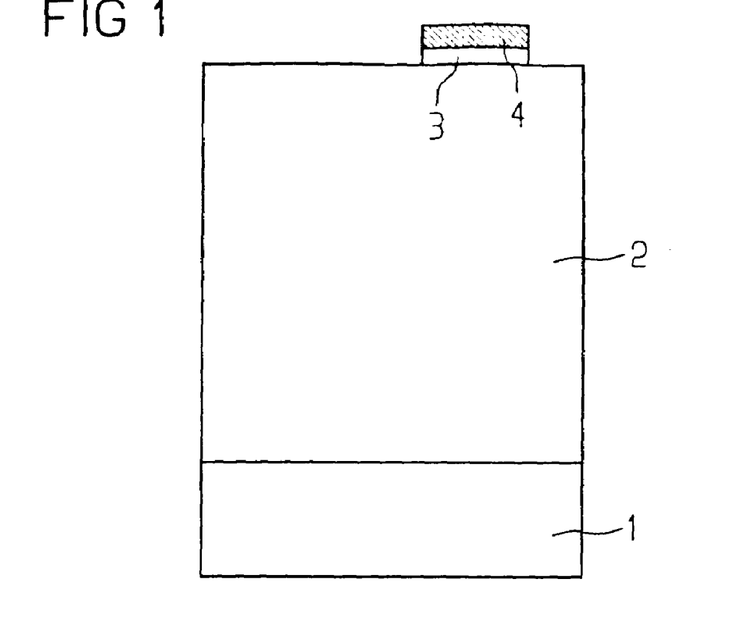
FIGS. 1 to 3 are schematic side views illustrating a novel method for producing an electrode configuration according to the invention.
Figure 2:
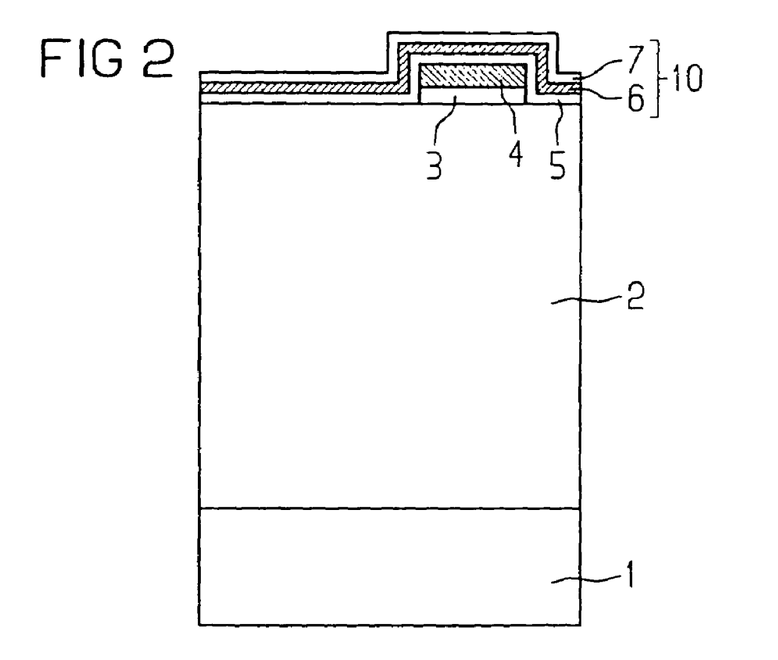
Figure 3:
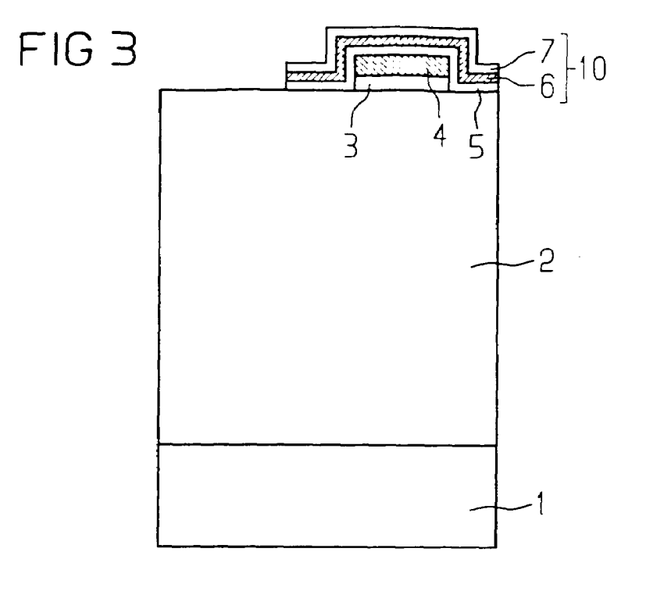

Referring now to the figures of the drawing in detail and first, particularly, to FIGS. 1 to 3 thereof, there is seen a sequence of process steps leading to an electrode configuration according to the invention. Within the framework of the normal process control, oxide is repeatedly deposited on a silicon substrate 1, with the result that, finally, an oxide layer 2 which is up to 2 mm thick is produced. A titanium layer 3 applied to the oxide layer 2 serves as barrier material for the subsequent platinum layer 4. The platinum layer 4 then serves as the bottom electrode for the capacitor of a memory cell and is therefore provided with a non-illustrated contact. The platinum layer 4 can be formed, for example, by sputtering. Then, the platinum layer 4 and the titanium layer 3 are structured. The structuring of the platinum layer 4 can be carried out by means of a TiN hard mask, analogously to the structuring of the top electrode described below. However, in the case of the platinum layer 4 (bottom electrode), the TiN hard mask is removed after the structuring. The resulting structure is shown in FIG. 1.

Subsequently, a barium strontium titanate layer 5 (BST, $(Ba,Sr)TiO_3$) is applied to the structure shown in FIG. 1. This layer is used later in the complete memory cell as a dielectric of the memory capacitor. A further platinum layer 6 is applied to the barium strontium titanate layer 5 as first conductive layer of the electrode configuration according to the invention. Then, a titanate nitride layer 7 is produced, as second conductive layer of the electrode configuration 10 according to the invention, on the platinum layer 6. The resulting structure is shown in FIG. 2.

The titanium nitride layer 7 is then structured by means of a phototechnique, in order to be able to serve as a "hard mask" for structuring the platinum layer 6 and the barium strontium titanate layer 5.

Then, reactive ion etching (RIE) is carried out in order to subject the platinum layer 6 to chemical/physical dry-etching. The etching gas used here is oxygen $O_2$ or a mixture of $O_2$ and further gases, for example argon. Instead of the reactive ion etching, other dry-etching methods, such as ion etching, magnetically enhanced reactive ion etching (ME-RIE), ECR (Electron Cyclotron Resonance) etching or inductively coupled plasma etching methods (ICP, TCP) can also be used, for example.

During the dry-etching of the platinum layer 6, non-volatile titanium oxide layers ($Ti_xO_y$) are continuously reformed on the surface of the titanium nitride mask 7, as a result of which the etching rate of the titanium nitride mask 7 is reduced still further. Correspondingly, the selectivity of the etching process is thus significantly increased. The associated lower degree of mask erosion thus results in a higher dimensional accuracy of the structuring. A suitable selection of the $O_2$ concentration makes it possible to set the edge angle of the etched edge on the platinum layer 6 over a wide range. In this way, the electrode configuration according to the invention can be produced with a high degree of dimensional accuracy.

If the regions of the platinum layer 6 which are not protected by the titanium nitride mask are removed, the corresponding regions of the barium strontium titanate layer 5 are subjected to the reactive ion etching. Again, the etching gas used here is oxygen $O_2$ or a mixture of $O_2$ and further gases, for example argon. The titanium nitride hard mask 7 is thereby "hardened" further.

Instead of the reactive ion etching, other dry-etching methods, such as for example ion etching, magnetically enhanced reactive ion etching (MERIE), ECR (Electron Cyclotron Resonance) etching or inductively coupled plasma etching methods (ICP, TCP) can also be used during the dry-etching of the barium strontium titanate layer 5. The structure which results after the dry-etching of the barium strontium titanate layer 5 is shown in FIG. 3.

The electrode configuration 10 according to the invention has the advantage that the titanium nitride layer 7 (second layer of the electrode configuration) causes the layer resistance of the entire electrode configuration 10 to be reduced, while the capacity remains approximately the same. As a result, the switching of the so-called "common plate" in the so-called "pulsed-plateline" mode of the memory cell is speeded up, causing the access time of the entire module to be shortened.

Figure 4:
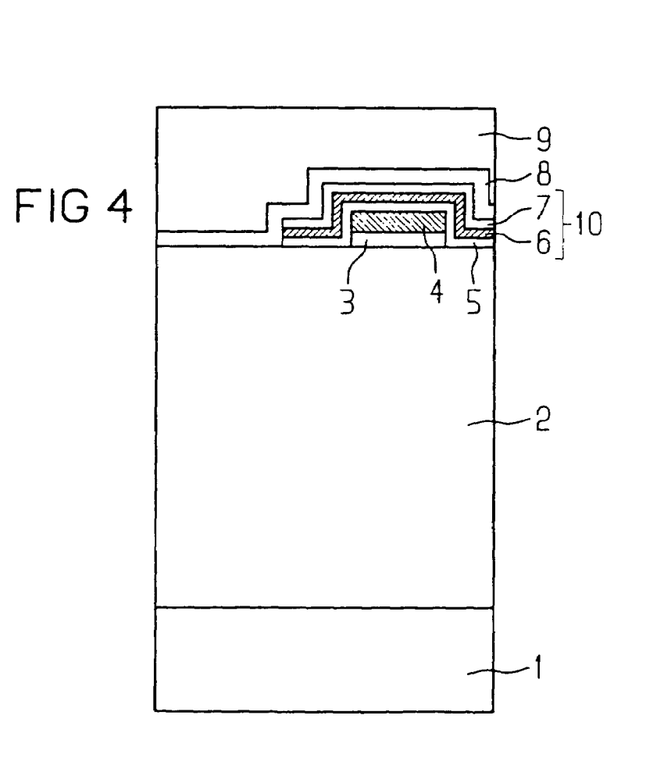
FIGS. 4 to 6 are schematic side views illustrating a novel method of electrically contacting the electrode configuration.
Figure 5:
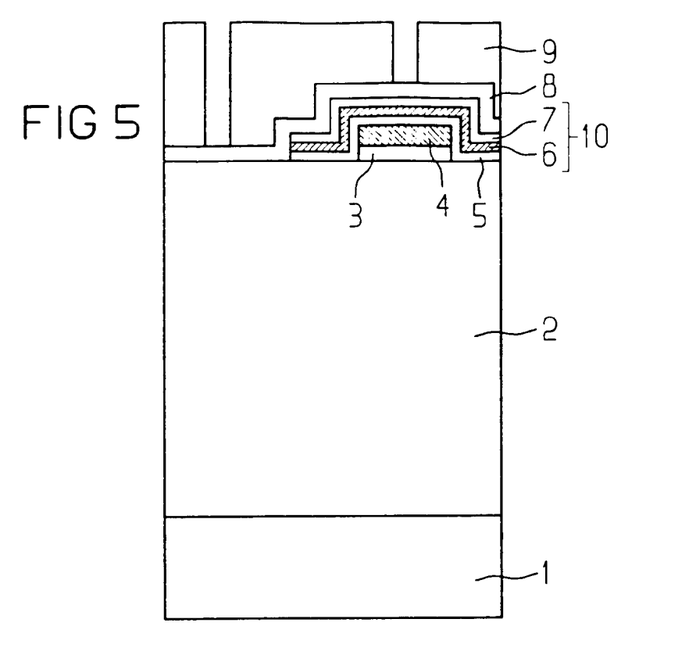
Figure 6:
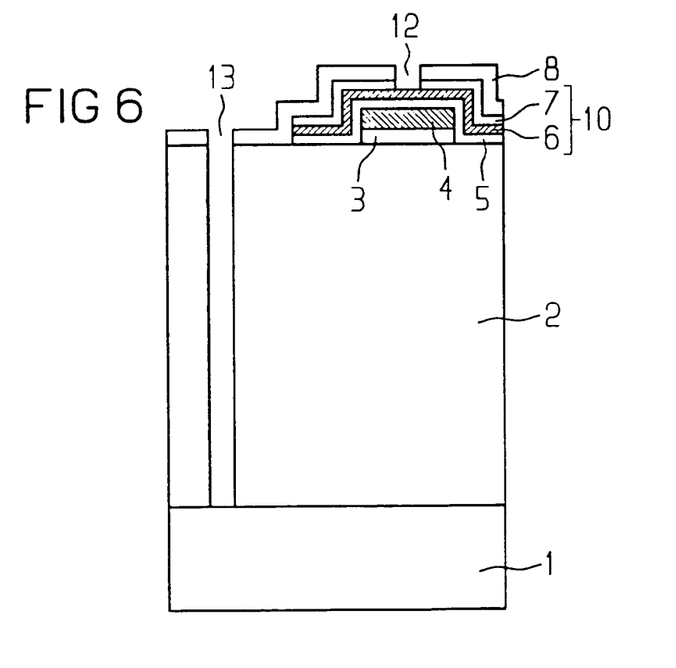

FIGS. 4 to 6 show a schematic illustration of a method according to the invention for making contact with the electrode configuration according to the invention.

A thin SiO$_2$ layer 8 is applied for insulation over the entire area of the structure shown in FIG. 3, for example by means of a TEOS process. Since the deposition of an oxide layer on platinum is problematic, the titanium nitride layer 7 (second layer of the electrode configuration) makes it possible to encapsulate the capacitor of the memory cell with an oxide layer. Then, a resist layer 9 is applied to the thin SiO$_2$ layer 8. The resulting structure is shown in FIG. 4.

At the points at which contact holes are to be produced later, the resist layer 9 is exposed. Then, the resist mask is developed, i.e. the exposed regions of the resist layer 9 are removed. The resulting structure is shown in FIG. 5.

Then, a plasma etching process is carried out in order to produce the contact holes 12 and 13. As a result of the different depths of the contact holes 12 and 13, the electrode configuration 10 according to the invention is subjected to long overetching.

However, the electrode configuration 10 according to the invention has, by virtue of the titanium nitride layer 7 (second layer of the electrode configuration), a greater thickness, with the result that breaking through of the electrode configuration 10 during the etching of contact holes is avoided.

Likewise, the formation of redepositions from the material of the first layer (platinum layer 6) during the overetching, which redepositions can be removed only with difficulty, is prevented.

Then, the resist layer 9 is removed, resulting in the structure shown in FIG. 6.

We claim:

1. A method of producing an electrode configuration, which comprises the following steps:
    forming a first conductive layer of the electrode configuration of a material substantially unetchable by chemical dry-etching, the first conductive layer containing a material selected from the group consisting of a 4d transition metal, a 5d transition metal, a conductive nitride thereof, and a conductive oxide thereof;
    forming a second conductive layer of the electrode configuration on the first conductive layer from a material etchable by chemical dry-etching, the second conductive layer containing a material selected from the group consisting of aluminum, titanium, tungsten, a conductive silicide thereof, a conductive nitride thereof, and a conductive oxide thereof;
    structuring the second conductive layer to form a structured second layer;
    chemical-physical dry etching the first conductive layer while using the structured second layer as a mask;
    applying at least one insulation layer on the electrode configuration, and structuring the insulation layer to form at least two contact holes with different depths; and
    subjecting the electrode configuration to overetching during etching of the contact holes having different depths;
    preventing, by the second conductive layer, breaking through of the electrode configuration and formation of redeposition of the material of the first conductive layer during the overetching.

2. The method according to claim 1, wherein the chemical-physical dry etching step comprises etching the first conductive layer with a plasma etching process.

3. The method according to claim 1, which comprises, during the chemical-physical dry etching step of the second conductive layer, providing at least one reactive substance which reacts with the material of the second conductive layer to form a non-volatile compound on the surface of the second conductive layer.

4. The method according to claim 3, wherein the reactive substance is a reactive gas.

5. The method according to claim 4, wherein the reactive gas is a gas selected from the group consisting of oxygen, nitrogen, hydrogen, halogens, gaseous halogen compounds, and a mixture thereof.

6. The method according to claim 1, which comprises providing an inert gas during the step of chemical-physical dry etching the first conductive layer.

7. The method according to claim 1, wherein the chemical-physical dry etching step of the first conductive layer is performed with an etching process selected from the group consisting of reactive ion etching, magnetically enhanced reactive ion etching, electron cyclotron resonance etching, and inductively coupled plasma etching.

8. The method according to claim 1, further comprising:
    depositing a conductive layer and filling in the contact holes.

9. The method according to claim 1, wherein the insulation layer is a silicon oxide layer.

10. The method according to claim 1, wherein the applying step comprises producing a silicon oxide layer by a TEOS process.

11. The method according to claim 1, wherein the applying step comprises producing a silicon oxide layer by a silane process.

12. The method according to claim 1, wherein the insulation layer contains a silicon layer.

13. The method according to claim 8, wherein the depositing step comprises depositing a material selected from the group consisting of aluminum, tungsten, and copper.

14. The method according to claim 1, further comprising chemical dry etching the second conductive layer while using the first structured layer as a barrier for the chemical dry-etching.

15. A method of producing an electrode configuration, which comprises the following steps:
    forming a first conductive layer of the electrode configuration of a material substantially unetchable by chemical dry-etching, the first conductive layer containing a material selected from the group consisting of ruthenium, rhodium, palladium, osmium, iridium, platinum, gold, silver and rhenium;
    forming a second conductive layer of the electrode configuration on the first conductive layer from a material etchable by chemical dry-etching, the second conductive layer containing a material selected from the group consisting of aluminum, titanium, tungsten, a conductive silicide thereof, a conductive nitride thereof, and a conductive oxide thereof;
    structuring the second conductive layer to form a structured second layer;
    chemical-physical dry etching the first conductive layer while using the structured second layer as a mask;
    applying at least one insulation layer on the electrode configuration, and structuring the insulation layer to form at least two contact holes with different depths; and
    subjecting the electrode configuration to overetching during etching of the contact holes having different depths;
    preventing, by the second conductive layer, breaking through of the electrode configuration and formation of redeposition of the material of the first conductive layer during the overetching.

16. A method of producing an electrode configuration, which comprises the following steps:
- forming a first conductive layer of the electrode configuration of a material substantially unetchable by chemical dry-etching, the material for forming the first conductive layer being selected from the group of platinum metals;
- forming a second conductive layer of the electrode configuration on the first conductive layer from a material etchable by chemical dry-etching, the material for forming the second conductive layer being titanium nitride;
- structuring the second conductive layer to form a structured second layer;
- chemical-physical dry etching the first conductive layer while using the structured second layer as a mask;
- applying at least one insulation layer on the electrode configuration, and structuring the insulation layer to form at least two contact holes with different depths; and
- subjecting the electrode configuration to overetching during etching of the contact holes having different depths;
- preventing, by the second conductive layer, breaking through of the electrode configuration and formation of redeposition of the material of the first conductive layer during the overetching.

* * * * *